(12) United States Patent

Johnson et al.

(10) Patent No.: US 10,637,424 B1
(45) Date of Patent: Apr. 28, 2020

(54) SYSTEMS AND METHODS OF PROCESSING INFORMATION REGARDING DETERMINATION OF GAIN OF AN AUDIO AMPLIFIER

(71) Applicant: ShotSpotter, Inc., Newark, CA (US)

(72) Inventors: Murphey L. Johnson, Newark, CA (US); Mark A. Sompel, Newark, CA (US); Robert B. Calhoun, Newark, CA (US)

(73) Assignee: ShotSpotter, Inc., Newark, CA (US)

( * ) Notice: Subject to any disclaimer, the term of this patent is extended or adjusted under 35 U.S.C. 154(b) by 0 days.

(21) Appl. No.: 16/150,193

(22) Filed: Oct. 2, 2018

(51) Int. Cl.
*H03G 3/30* (2006.01)
*H04R 29/00* (2006.01)

(52) U.S. Cl.
CPC ........... *H03G 3/3089* (2013.01); *H04R 29/00* (2013.01); *H03G 3/3005* (2013.01)

(58) Field of Classification Search
CPC ...... H04R 29/00; H04R 29/004; H04R 1/326; H04R 29/006; H03G 3/3089; H03G 3/3005; H03M 1/00; H03M 1/10; H03M 1/1004; H03M 1/1009; H03M 1/1019; H03M 1/1071; H03M 1/1085
See application file for complete search history.

(56) References Cited

U.S. PATENT DOCUMENTS

| | | | | |
|---|---|---|---|---|
| 6,809,668 B2 * | 10/2004 | Asami | ................ | G01R 19/2509 341/118 |
| 2005/0169483 A1 * | 8/2005 | Malvar | .................. | H04R 3/005 381/58 |
| 2006/0232460 A1 * | 10/2006 | Huang | ................ | H03M 1/1019 341/155 |

* cited by examiner

Primary Examiner — Jason R Kurr
(74) Attorney, Agent, or Firm — Greenberg Traurig, LLP (57) ABSTRACT

Systems and methods for processing information present in a digital audio stream to obtain a measure of gain of an analog-to-digital converter (ADC) preamplifier are disclosed. In one implementation, a method of processing information present in a digitally sampled stream to obtain a measure of ADC preamplifier gain used to digitize the output of a known transducer comprises transforming time-domain digital samples into the frequency domain through use of a discrete Fourier transform (DFT), and using knowledge of the maximum effective frequency associated with the frequency response of the transducer to process frequency-domain data to obtain a measure of the gain of the ADC preamplifier.

20 Claims, 7 Drawing Sheets

SYSTEMS AND METHODS OF PROCESSING INFORMATION REGARDING DETERMINATION OF GAIN OF AN AUDIO AMPLIFIER

BACKGROUND

Field

The present invention relates to processing information present in a digital audio stream to obtain a measure of gain of an analog-to-digital converter (ADC) preamplifier.

Description of Related Information

Many commercially available audio ADC integrated circuits offer ability for a user to set preamplifier gain through the use of digital registers. Some ADC chips also provide optional automatic level control (ALC), which can increase or decrease preamplifier gain in response to input levels, maintaining desired maximum, minimum, or maximum and minimum levels at the input to the ADC. For some of these integrated circuits, the currently requested gain setting is not available through digital register outputs. In such cases, the best way for the user to know the present gain setting is to keep track of the most recent setting request since a reset or power cycle. Once the user has enabled ALC, however, the gain may be anywhere within a permitted range, and the user has no way to know what the exact value is at a specific time.

In some applications, there is a need to know the preamplifier gain employed at the time that a digital audio recording was made, whether or not the hardware makes this information available to the user.

For most microphones currently used in consumer electronics, at or below 20 kHz, the microphone response begins to fall off significantly with increasing frequency. By sampling at 44.1 kHz, or higher, recording devices are able to ensure that the Nyquist frequency is above the effective frequency range of the microphone. There is typically a range of at least several kilohertz between the highest signal frequency expected at the preamplifier input and the sampling rate's Nyquist frequency. The quiescent circuit noise present in this range is amplified by the preamplifier and encoded into the audio stream by the ADC.

The discrete Fourier transform (DFT), usually implemented using an efficient fast Fourier transform (FFT), is a known method for analyzing a finite digital data stream in the frequency domain. When combined with an appropriate overlapping window technique, it can be used to process a continuous stream, at regular intervals providing a changing breakdown of the frequency content of the signal.

Overview of Some Innovations Herein

Systems and methods for processing information present in a digital audio stream to obtain a measure of gain of an analog-to-digital converter (ADC) preamplifier are disclosed. In one implementation, a method of processing information present in a digitally sampled stream to obtain a measure of ADC preamplifier gain used to digitize the output of a known transducer comprises transforming time-domain digital samples into the frequency domain through use of a discrete Fourier transform (DFT), and using knowledge of the maximum effective frequency associated with the frequency response of the transducer to process frequency-domain data to obtain a measure of the gain of the ADC preamplifier.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and sub-combinations of the disclosed features and/or combinations and sub-combinations of several further features disclosed below in the detailed description.

BRIEF DESCRIPTION OF THE DRAWINGS

The accompanying drawings, which constitute a part of this specification, illustrate various embodiments and aspects of the present invention and, together with the description, explain various aspects of the innovations herein. In the drawings.

DETAILED DESCRIPTION OF ILLUSTRATIVE IMPLEMENTATIONS

Reference will now be made in detail to the inventions herein, examples of which are being illustrated in the accompanying drawings. The implementations set forth in the following description do not represent all implementations consistent with the disclosed technology. Instead, they are merely some examples consistent with certain aspects related to the present inventions. Wherever possible, the same reference numbers will be used throughout the drawings to refer to the same or like parts.

As set forth in various implementations described below, innovations herein provide a means to obtain an accurate estimate of ADC preamplifier gain from the output audio data stream by making use of windowed DFTs.

Figure 1:
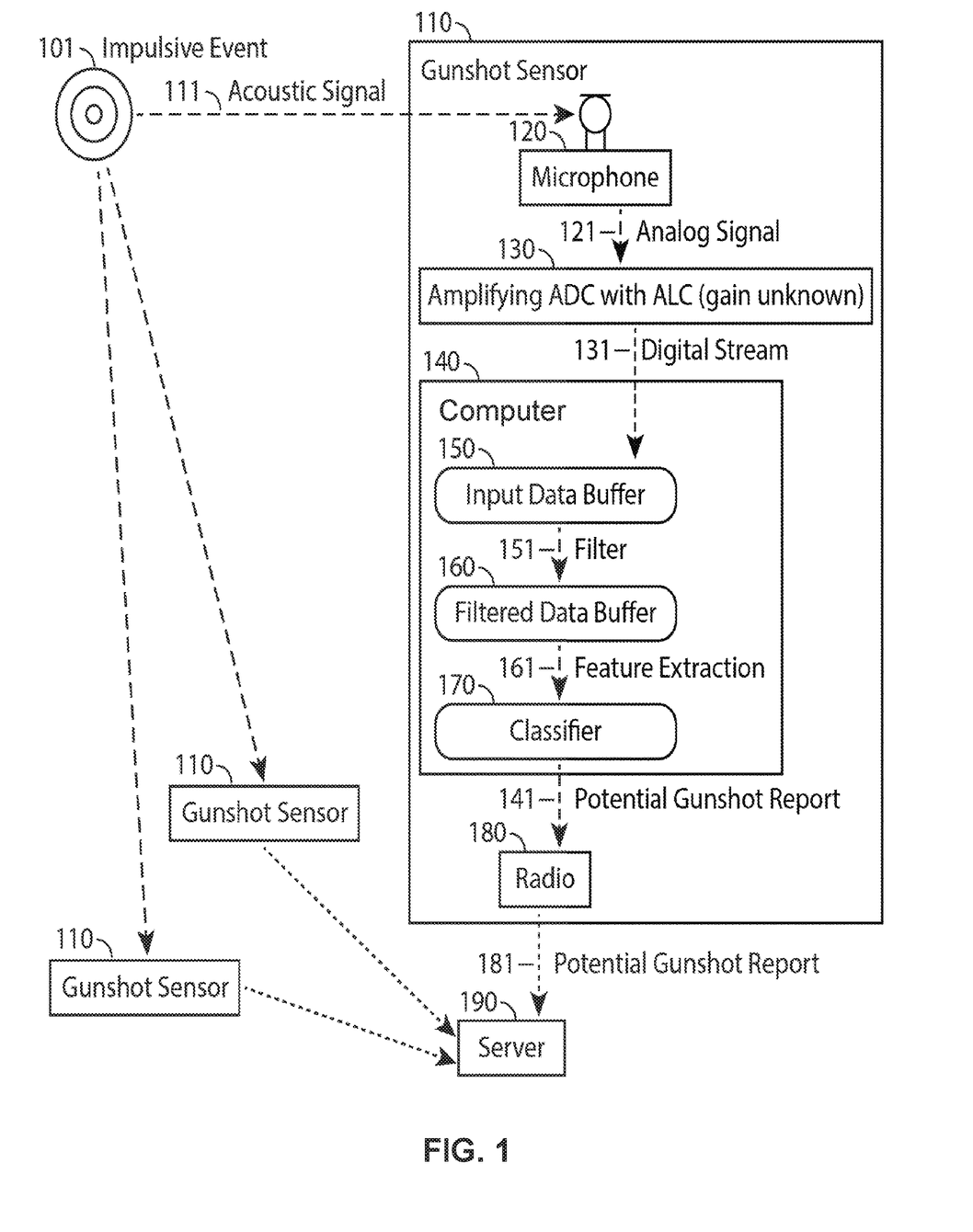
FIG. 1 is a diagram showing an ADC with ALC (automatic level control) used to process the signal from a microphone as part of a gunshot detection system employing a distributed array of sensors, relating to aspects of the innovations herein.

FIG. 1 illustrates aspects of negative impact that unknown ADC gain can have in a distributed acoustic gunshot-detection system. As shown in FIG. 1, an acoustic signal/signature 111 of an impulsive event 101 is received by microphone 120 at sensor 110. The analog signal 121 output from the microphone is processed by an amplifying ADC 130. In the implementation shown, since automatic level control (ALC) is employed by the ADC to reduce clipping, the ADC preamplifier gain may vary over time and is unknown. The digital stream 131 output from the ADC is processed by via computer 140, such as a digital computer, which ultimately extracts features 161 from the signal in an effort to estimate the likelihood that the source event 101 was a gunshot. While reduced clipping enhances feature extraction, the lack of a known gain unduly limits the usefulness of features that are related to absolute signal amplitude or to changes in signal amplitude over time. This ultimately limits classification of the impulsive event 101, both locally (e.g., at a classifier component 170 of the sensor) and at the server 190 where information from multiple sensors is combined. Here, it is also noted that additional details of the computer 140 (e.g. digital computer), such as an input data buffer 150, a filtered data buffer 160, and a classifier 170, are also set forth further below in connection with FIG. 6.

Figure 2A:
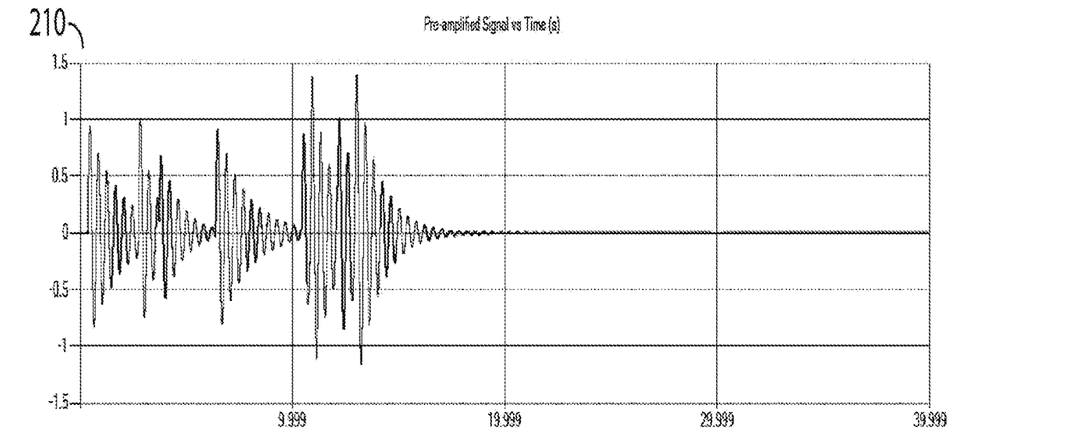
FIGS. 2A, 2B and 2C are illustrative diagrams showing time-aligned plots of an exemplary pre-amplified time-domain signal that would result in clipping without ALC; the changing normalized gain values employed by ALC in response to the signal; and ALC-modified, unclipped audio to be sampled by the ADC, consistent with certain aspects related to the innovations herein.
Figure 2B:
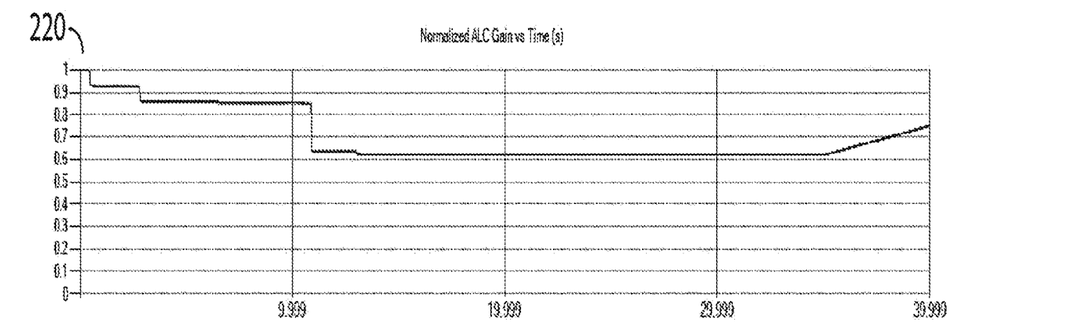
Figure 2C:
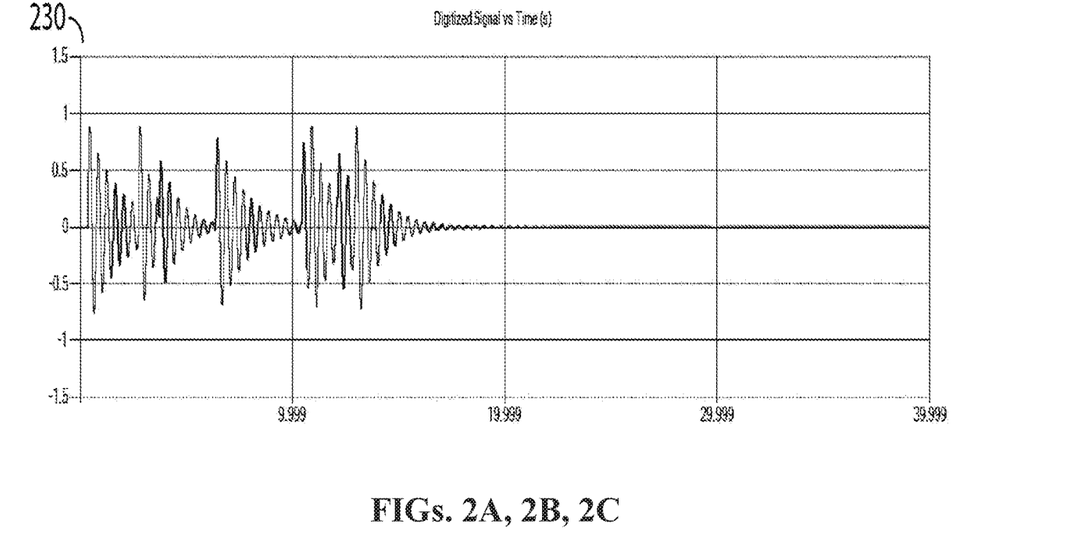

FIGS. 2A, 2B and 2C are exemplary graphs illustrating comparative signal and gain information in which the gain of an ADC system may be modified automatically, beyond the control of the user. In the example illustrated, the pre-amplified signal at maximum gain 210 (e.g., analog signal 121) and the amplified signal with ALC-modified gain 230 (e.g., digital stream 131) are shown, which reflect the changing value of gain, shown at 220, whose value is unavailable to the user. In this representative example, the ALC hold time is 21.832 seconds; attack time is 8.6 seconds, decay time is 34.41 seconds; maximum normalized gain is 1.0; target output amplitude is 0.708; and a peak limiter comes into play with an 8.4-second attack time when output amplitude exceeds 0.875. These figures also illustrate the effectiveness of ALC in reducing the incidence of clipping.

Figure 3:
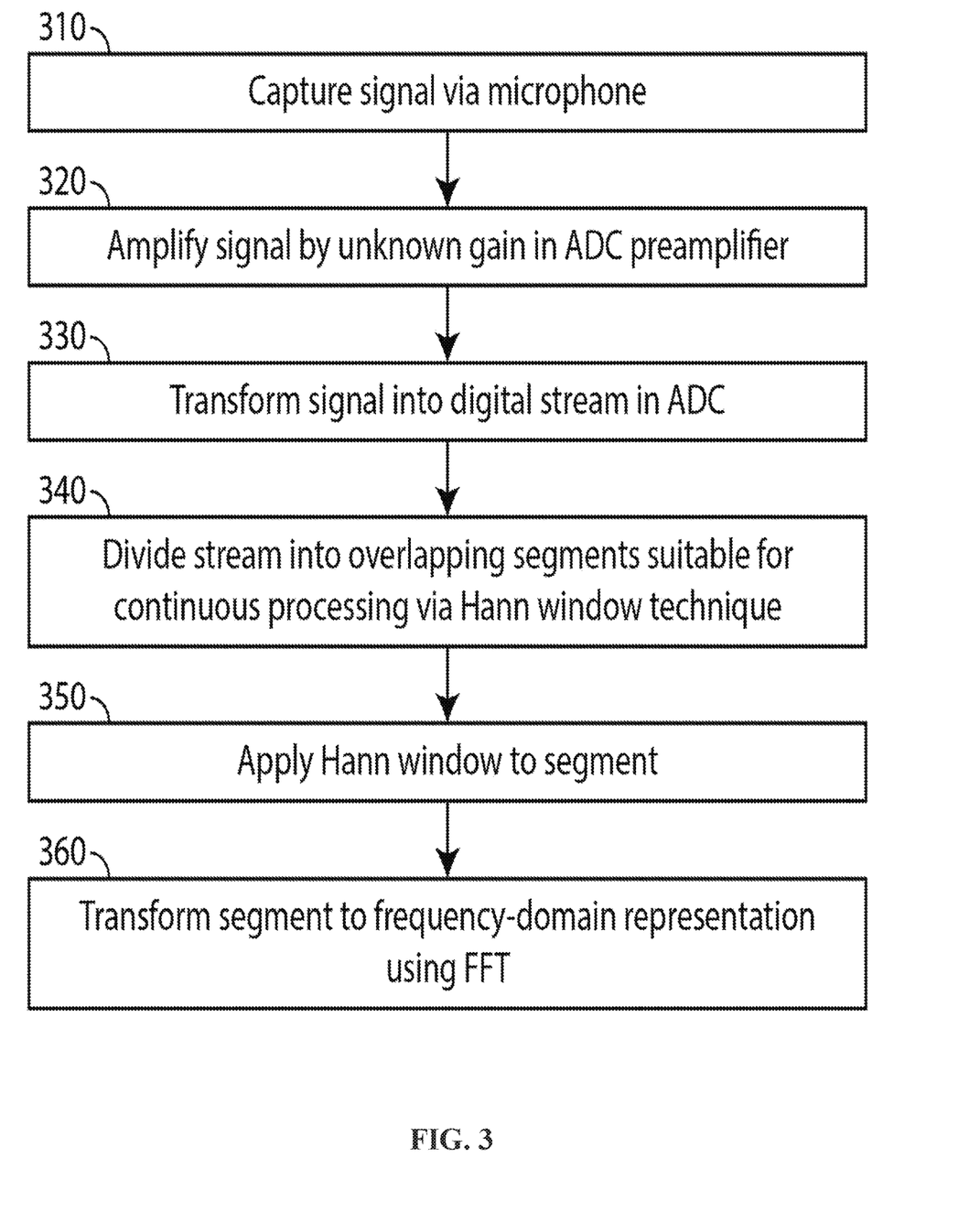
FIG. 3 is a flow diagram depicting an illustrative process in which an acoustic signal is captured via microphone, amplified, sampled, windowed, and converted to frequency domain.

FIG. 3 shows an illustrative process in which a microphone converts an acoustic signal into an analog signal 310 which is then amplified by an unknown gain 320 and converted into a digital stream 330. Ideally and in most circumstances, this conversion is done at a sampling rate that is more than twice the maximum effective frequency response of the microphone. The digital signal stream is divided into overlapping segments 340, and to each segment a Hann window is applied 350. Each windowed segment is then converted into a frequency-domain representation 360 which might typically be used for some combination of signal analysis and/or filtering.

Figure 4:
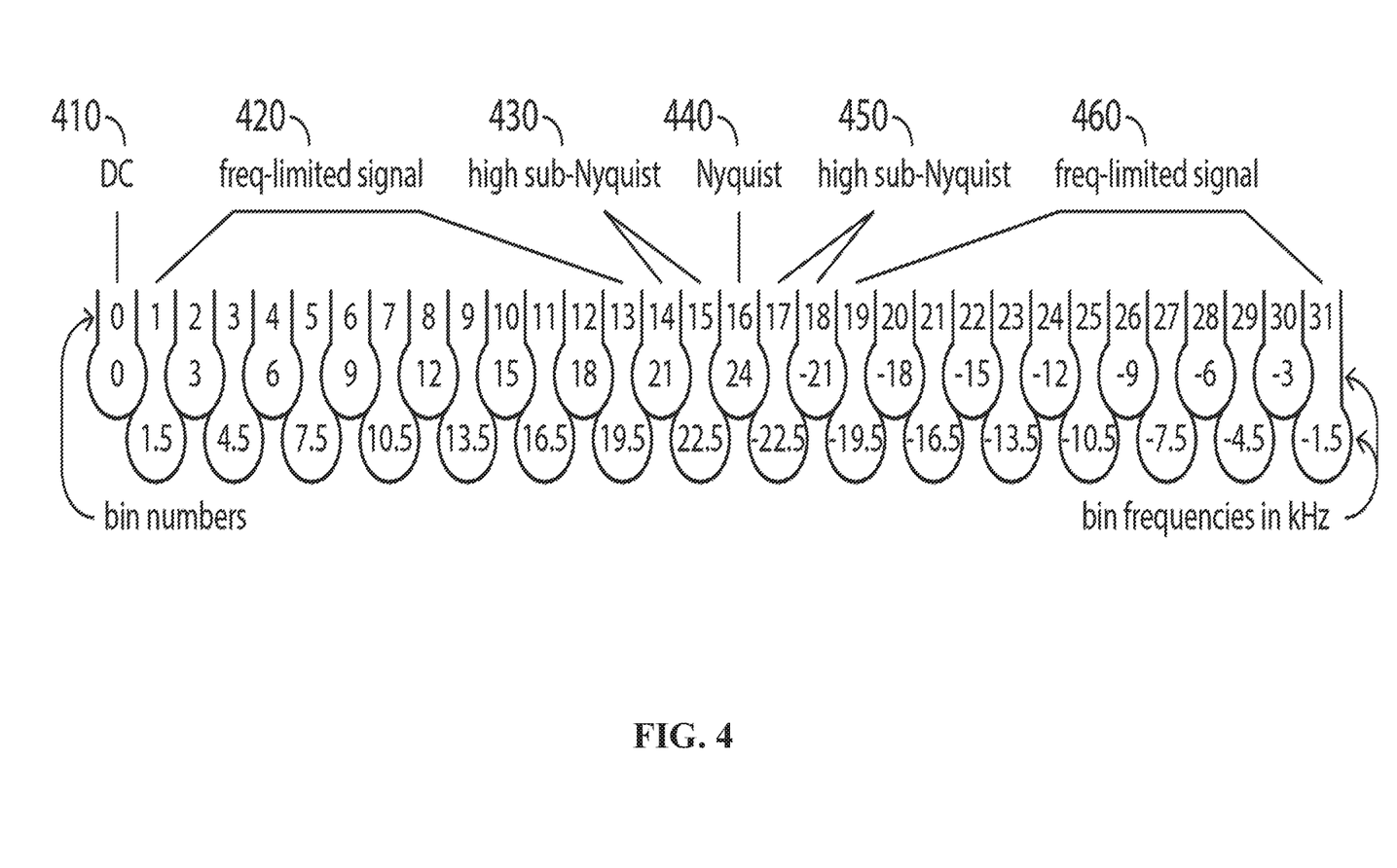
FIG. 4 is an illustrative diagram showing the numbered output bins of a DFT and indicating those frequency bins that contain the frequency-limited, amplified, source signal along with amplified circuit noise, as well as those that contain only amplified circuit noise, consistent with certain aspects related to the innovations herein.

FIG. 4 shows the binned output structure of a discrete Fourier transform (DFT). The Nyquist frequency is $f_S/2$, where $f_S$ is the sampling rate. Each bin represents a frequency range of $f_S/N$, where N is the size of the DFT. In this example, the sampling rate is 48 kHz and N=32. The steady-state contribution of the transformed stream is in bin 0, at 410. The contribution from frequencies at or near the Nyquist frequency is in bin N/2=16, at 440. Positively phased frequencies are in bins 1 through N/2−1, at 420, 430. Negatively phased frequencies are in bins N/2+1 to N−1, at 450, 460.

If the maximum frequency of expected signal is designated $f_M$, bins 1 through $(f_M/f_S)N$ 420 contain positively phased contributions from the signal while bins $(1-f_M/f_S)N$ through N−1 460 contain negatively phased contributions from the signal.

When the input signal is not saturated, bins $(f_M/f_S)N+1$ through $(1-f_m/f_S)N-1$, at 430, 440, 450, contain amplified circuit noise while excluding the desired signal from the original microphone. This is because the frequency content of these bins is above that capable of being produced by the microphone. According to implementations herein, a subset of the magnitudes of these bins can be used to estimate the gain of the amplifier.

In the example of FIG. 4, the maximum frequency response $f_M$ of the input microphone is assumed to be 20 kHz. Signals associated with the microphone are found in the steady-state bin 410, the positively phased bins numbered 1 through 13 at 420, and the negatively phased bins numbered 19 through 31 at 460. Bins 14 and 15, at 430, and bin 16, at 440, contain amplified circuit noise which may be used to estimate the gain of the ADC. Since the input signal is real-valued, bins 17 and 18, at 450, contain the same information as bins 14 and 15, but with inverse phase.

When the amplified source signal exceeds the input range of the ADC, saturation and clipping occur. The sharp edges associated with clipping add signal-related components to the high-frequency bins, rendering them unsuitable for gain estimation. If clipping is detected in the pre-window time domain despite the action of ALC, then the output of the DFT for that segment of data should not be used to estimate gain. Here, for example, the gain estimate based on the previous DFT can be maintained until clipping is no longer present.

Upon completion of each DFT, implementations herein compute and combine the magnitudes of complex values of one or more frequency bins in the specified noise range. The combined value may for example be a weighted or unweighted sum, mean, and/or median of the individual magnitude values. The combined value is one or more of sorted to produce a median value, smoothed, or averaged, over one or more subsequent DFTs. The resulting value is referred to herein as the High Sub-Nyquist Magnitude (HSNM).

Amplitude changes in the HSNM will track or correspond to equivalent changes in the gain of the ADC preamplifier.

Figure 7:
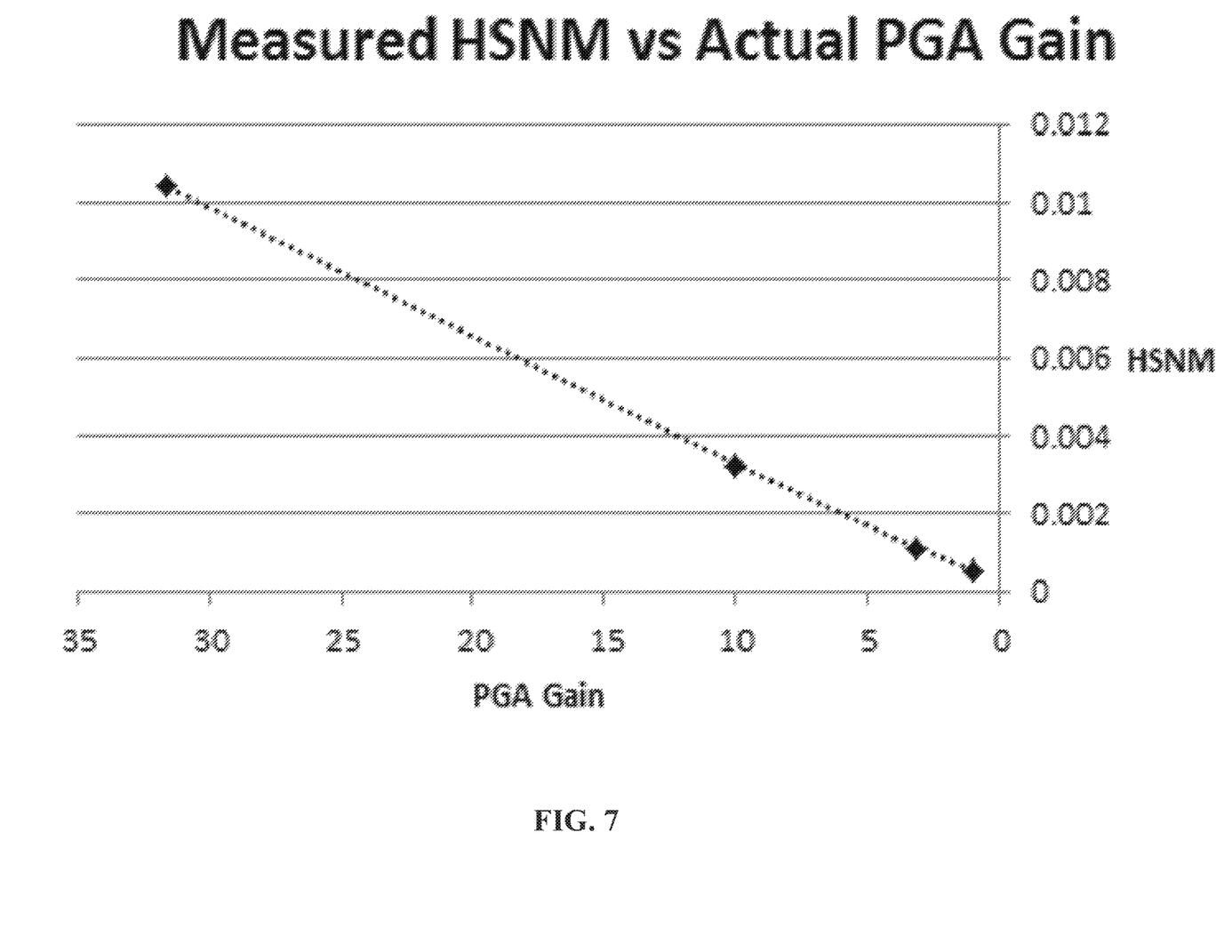
FIG. 7 is a plot of experimentally derived gain estimates versus known ADC gain levels obtained via the innovations described herein.

In some implementations, the HSNM can be mapped to a known gain setting using an experimentally derived calibration curve. FIG. 7 shows several experimentally derived data points for HSNM values at known gain settings. In experimental implementations of the method described herein, for example, with the ALC disabled, the ADC preamplifier gain was manually set to four different levels: 30 dB, 20 dB, 10 dB, and 0 dB. Unclipped signals at various levels below saturation were processed to obtain a number of HSNM values whose mean values are plotted in the figure.

In other implementations, the HSNM may be compared to a long-term mean, median, or smoothed combination of previous values to accurately estimate changes from steady-state gain such as those produced by ALC.

Exemplary Systems and Methods

Figure 5:
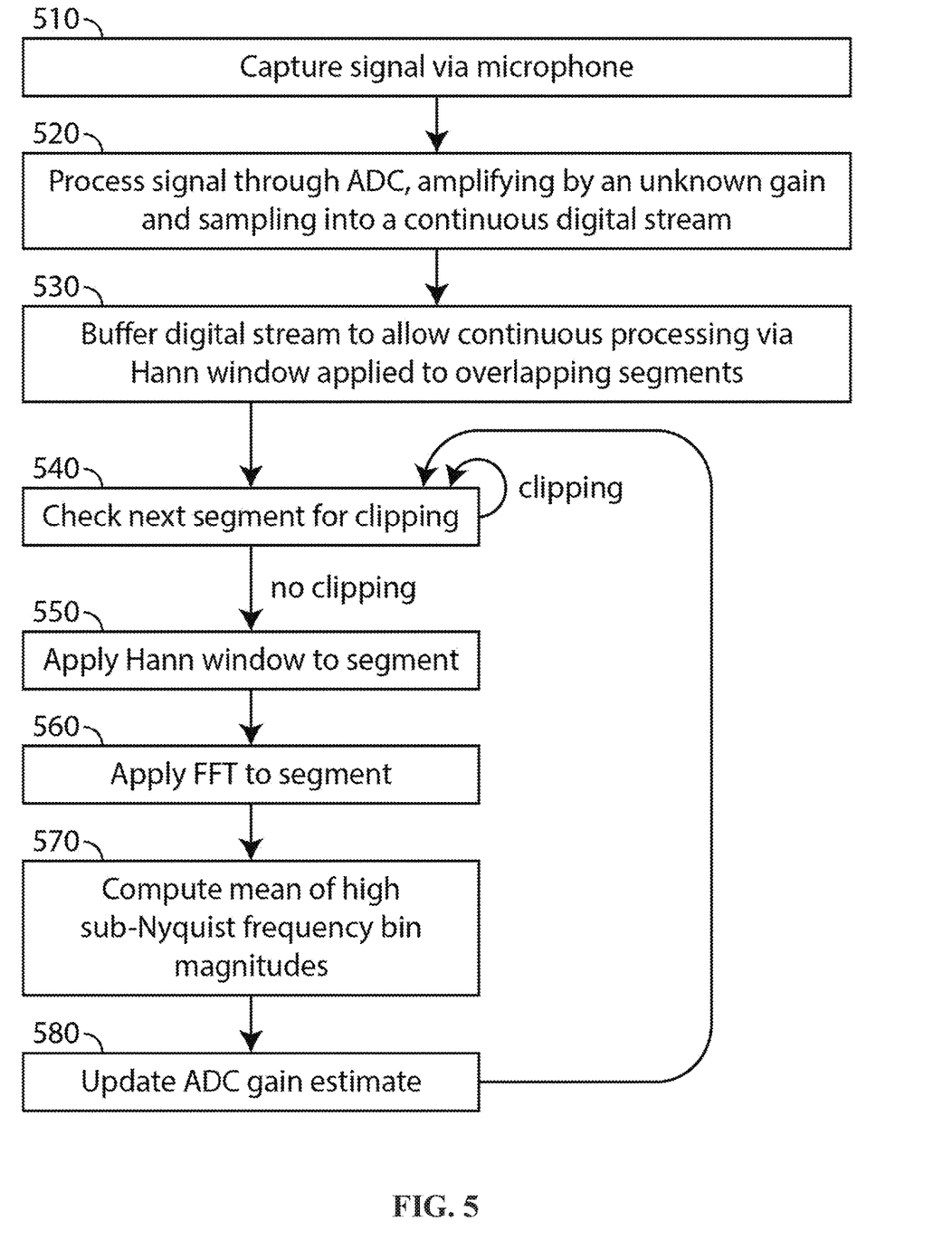
FIG. 5 is a flow diagram illustrating an exemplary process in which an acoustic signal is captured by a microphone and processed by an amplifying ADC, creating sampled output that is then buffered and continuously processed via a windowed FFT, the output of which is used to estimate the gain of the ADC's amplifier, consistent with certain aspects related to the innovations herein.
Figure 6:
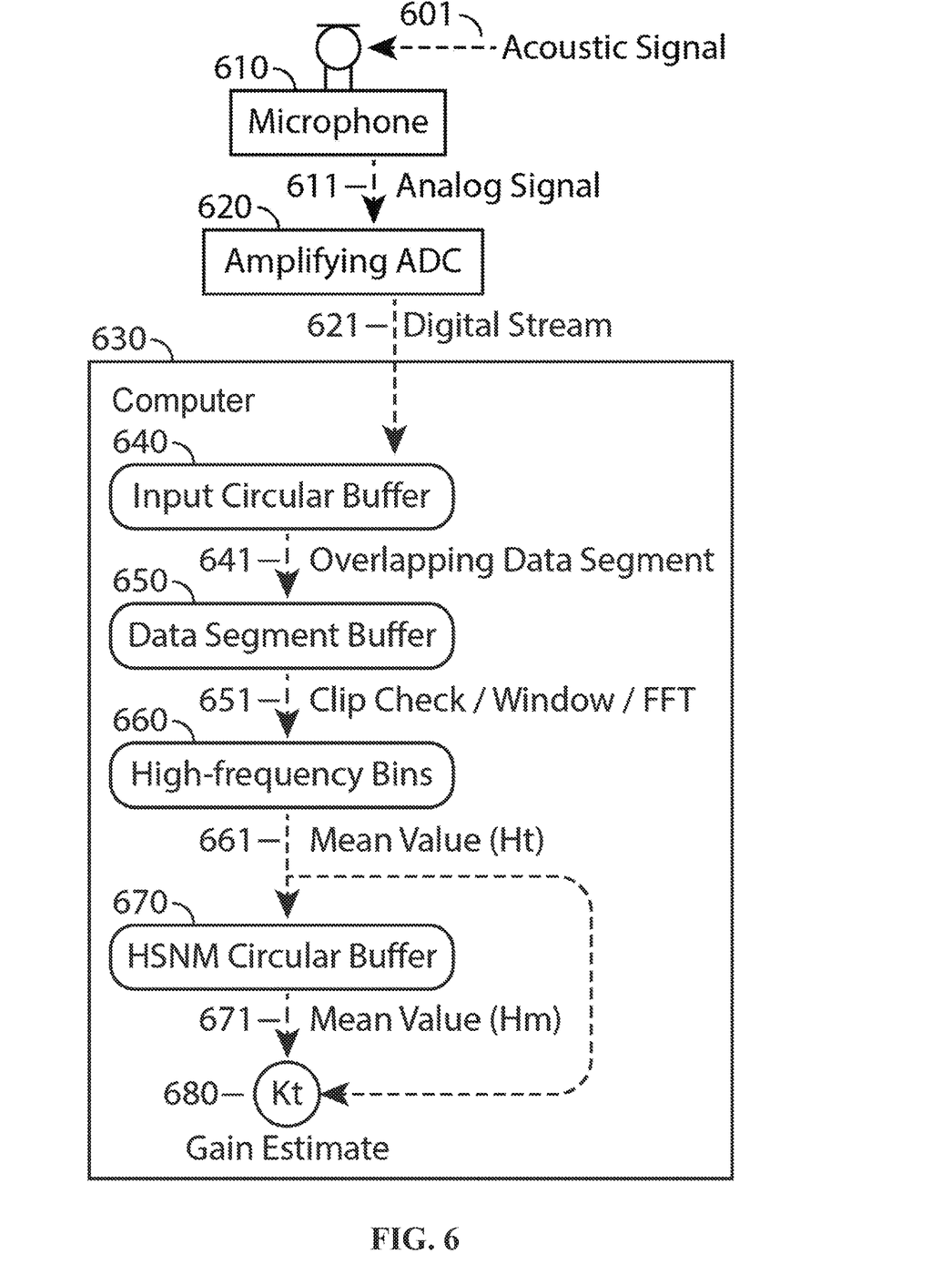
FIG. 6 is a flow diagram illustrating an exemplary process in which an airborne acoustic signal is captured by a microphone and processed by an amplifying ADC with unknown gain, creating sampled output that is then buffered and continuously processed via a windowed FFT, the output of which is used to estimate the gain of the ADC's amplifier, consistent with certain aspects related to the innovations herein.

FIG. 5 is a flow diagram of an illustrative process, consistent with certain aspects related to the innovations herein. FIG. 6 is a diagram of an illustrative device employing such a process, consistent with certain aspects related to the innovations herein.

Referring to both FIG. 5 and FIG. 6, an airborne acoustic signal 601 is captured, at 510, by a microphone 610 with a maximum effective frequency of 20 kHz. The output from the microphone 611 is processed by an amplifying ADC 620 that employs ALC to avoid saturation while sampling at a frequency of 48 kHz, at 520 in FIG. 5. The sampled output 621 is then processed by at least one digital computer 630 which first stores the data, e.g. at 530, in an input circular buffer 640.

According to implementations herein, overlapping sequences consisting of N adjacent samples of time-domain data 641 may be serially copied from the input circular buffer into a data segment buffer 650 and tested for clipping, e.g. at 540. If clipping is not present, the buffered data segment is subjected to application of a Hann window function, at 550, followed by an FFT, at 560, to produce frequency data 651. Following each FFT, magnitudes of frequency bin data from 21 kHz to 24 kHz 660 are averaged to produce the HSNM values, at 570, which we will refer to as $H_t$ 661. $H_t$ is proportional to the average amplifier gain $K_t$ over the period of time that the samples in each sequence were taken.

The HSNM is stored in an HSNM circular buffer 670 to allow averaging over a large number of data segments. The averaged result is referred to as $H_m$ 671. $H_m$ is assumed to represent the maximum gain level $K_m$ allowed by ALC settings. The updated estimate of gain 680 of the ADC preamplifier for a particular segment may be computed to be $K_t=(H_t/H_m)K_m$, e.g. as shown at 580 of FIG. 5.

As disclosed herein, embodiments and features of the disclosed technology may be implemented through computer-hardware, software and/or firmware. For example, the systems and methods disclosed herein may be embodied in various forms including, for example, at least one data processor, such as a computer that also includes a database, digital electronic circuitry, firmware, software, or embodied in combinations thereof. Further, while some of the disclosed implementations describe signal processing functionality that may be implemented via software, systems and methods consistent with the present invention may be implemented with any combination of hardware, software and/or firmware. Moreover, the above-noted features and other aspects and principles of the disclosed technology may be implemented in various environments. Such environments and related applications may be specially constructed for performing the various processes and operations according to the present inventions or they may include a general-purpose computer or computing platform selectively activated or reconfigured by code to provide the necessary functionality. The innovations disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

The systems and methods disclosed herein may be implemented as a computer program product, i.e., a computer program tangibly embodied in an information carrier, e.g., in memory, in one or more machine-readable storage media and/or in other computer-readable components, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. Methods and computer programs herein may be deployed to be executed on one computer or on multiple computers at one site or distributed across multiple sites and interconnected, e.g., by at least one communication network.

It is to be understood that the foregoing description is intended to illustrate and not to limit the scope of the disclosed inventions, which are defined by the scope of the appended claims. Other embodiments are within the scope of the following claims.

What is claimed is:

1. A method of processing information present in a digitally sampled stream to obtain a measure of gain of a preamplifier of an analog-to-digital converter (ADC) used to digitize the output of a transducer, the method comprising:
transforming time-domain digital samples into the frequency domain through use of a discrete Fourier transform (DFT); and
utilizing information regarding maximum effective frequency associated with a frequency response of the transducer to process frequency-domain data to obtain the measure of the gain of the preamplifier of the ADC.

2. The method of claim 1, further comprising:
utilizing the maximum effective frequency of the transducer to identify DFT frequency bins that contain information resulting from amplified circuit noise without transducer signal content.

3. The method of claim 2, further comprising:
statistically combining magnitudes of a subset of the DFT frequency bins, above the maximum effective frequency of the transducer, to produce a measure of central tendency in the selected domain of frequencies.

4. The method of claim 3, further comprising:
utilizing the measure of central tendency to obtain or look up pre-calibrated ADC gain values to determine an average gain setting in use during a period of time that the samples were digitized.

5. The method of claim 3, further comprising:
using a windowing method to repeatedly execute the DFT on overlapping sequences of time-domain data such that each sequence of data results in computation of the measure of central tendency for each said sequence.

6. The method of claim 5, further comprising:
utilizing the measure of central tendency for each sequence to obtain or look up pre-calibrated ADC gain values to estimate an average gain setting in use during a period of time that the sequence was digitized.

7. The method of claim 5, further comprising:
utilizing a smoothed, averaged, or median value of two or more previous values of the measure of central tendency for each sequence to obtain or look up pre-calibrated ADC gain values to estimate an average gain setting in use during a period of time that the sequence was digitized.

8. The method of claim 5, further comprising:
dividing the measure of central tendency by a smoothed, averaged, or median value of two or more previous values of the measure of central tendency to find a ratio; and
multiplying the ratio by a known maximum gain setting to estimate an average gain setting in use during a period of time that the sequence was digitized.

9. The method of claim 5, further comprising:
dividing a smoothed, averaged, or median value of two or more previous values of the measure of central tendency by a smoothed, averaged, or median value of three or more previous values of the measure of central tendency to find a ratio; and
multiplying the ratio by a known maximum gain setting to estimate an average gain setting in use during a period of time that the sequence was digitized.

10. The method of claim 9, further comprising:
utilizing the measure of central tendency for each sequence to obtain or look up pre-calibrated ADC gain values to estimate the average gain setting in use during the period of time that the sequence was digitized.

11. A system that processes information present in a digitally sampled stream to obtain a measure of gain of a preamplifier of an analog-to-digital converter (ADC) used to digitize the output of a transducer, the system comprising:
one or more computer, computer processor and/or computer-readable media containing and/or executing computer-executable instructions for processing the information, the computer-executable instructions being executable, via one or more processing components, to process instructions including:
transforming time-domain digital samples into frequency domain through use of a discrete Fourier transform (DFT); and
utilizing information regarding maximum effective frequency associated with frequency response of the transducer to process frequency-domain data to obtain the measure of the gain of the preamplifier of the ADC.

12. The system of claim 11, wherein the maximum effective frequency of the transducer is used to identify DFT frequency bins that contain information resulting from amplified circuit noise without transducer signal content.

13. The system of claim 12, wherein magnitudes of a subset of the DFT frequency bins, above the maximum effective frequency of the transducer, are statistically combined to produce a measure of central tendency in a domain of frequencies.

14. The system of claim 13, wherein the measure of central tendency is used to look up pre-calibrated ADC gain values to determine an average gain setting in use during a period of time that samples were digitized.

15. The system of claim 13, wherein a windowing system is used to repeatedly execute the DFT on overlapping sequences of time-domain data such that each sequence of data results in computation of the measure of central tendency for that sequence.

16. The system of claim 15, wherein the measure of central tendency for each sequence is used to look up pre-calibrated ADC gain values associated with the preamplifier to estimate an average gain setting in use during a period of time that the sequence was digitized.

17. The system of claim 15, wherein a smoothed, averaged, or median value of two or more previous values of the measure of central tendency for each sequence is used to look up pre-calibrated ADC gain values to estimate an average gain setting in use during a period of time that the sequence was digitized.

18. The system of claim 15, wherein the measure of central tendency is divided by a smoothed, averaged, or median value of two or more previous values of the measure of central tendency to find a ratio which is then multiplied by a known maximum gain setting to estimate an average gain setting in use during a period of time that the sequence was digitized.

19. The system of claim 15, wherein a smoothed, averaged, or median value of two or more previous values of the measure of central tendency is divided by a smoothed, averaged, or median value of three or more previous values of the measure of central tendency to find a ratio which is then multiplied by a known maximum gain setting to estimate an average gain setting in use during a period of time that the sequence was digitized.

20. The system of claim 13, wherein the DFT is repeatedly executed on overlapping sequences of time-domain data such that each sequence of data results in computation of the measure of central tendency for each said sequence, and wherein the measure of central tendency is utilized for each said sequence to obtain or look up pre-calibrated ADC gain values to estimate an average gain setting in use during a period of time that the sequence was digitized.

* * * * *